United States Patent
Sickler et al.

(10) Patent No.: US 8,207,051 B2
(45) Date of Patent: Jun. 26, 2012

(54) SEMICONDUCTOR SURFACE MODIFICATION

(75) Inventors: Jason Sickler, Arlington, MA (US); Keith Donaldson, Beverly, MA (US)

(73) Assignee: SiOnyx, Inc., Beverly, MA (US)

( * ) Notice: Subject to any disclaimer, the term of this patent is extended or adjusted under 35 U.S.C. 154(b) by 187 days.

(21) Appl. No.: 12/431,448

(22) Filed: Apr. 28, 2009

(65) Prior Publication Data
US 2010/0270635 A1  Oct. 28, 2010

(51) Int. Cl.
*H01L 31/101* (2006.01)
*H01L 21/66* (2006.01)
*B05C 11/10* (2006.01)

(52) U.S. Cl. ......... 438/510; 438/14; 438/54; 438/914; 257/431; 257/E31.054; 257/E21.529; 118/689

(58) Field of Classification Search ........... 438/914, 438/510
See application file for complete search history.

(56) References Cited

U.S. PATENT DOCUMENTS

| | | | |
|---|---|---|---|
| 420,145 A | 5/1980 | Trapani | |
| 4,277,793 A | 7/1981 | Webb | |
| 496,578 A | 10/1990 | Land et al. | |
| 5,383,217 A * | 1/1995 | Uemura | 372/58 |
| 5,454,347 A * | 10/1995 | Shibata et al. | 117/202 |
| 577,382 A | 6/1998 | Osajda et al. | |
| 5,943,584 A * | 8/1999 | Shim et al. | 438/398 |
| 6,071,796 A * | 6/2000 | Voutsas | 438/487 |
| 6,580,053 B1 * | 6/2003 | Voutsas | 219/121.66 |
| 6,607,927 B2 * | 8/2003 | Ramappa et al. | 438/14 |
| 6,818,535 B2 | 11/2004 | Lu et al. | |
| 705,725 A1 | 6/2006 | Carey, III et al. | |
| 7,057,256 B2 * | 6/2006 | Carey et al. | 257/463 |
| 7,211,501 B2 | 5/2007 | Liu et al. | |
| 7,247,812 B2 * | 7/2007 | Tsao | 219/121.65 |
| 735,479 A1 | 4/2008 | Carey, III et al. | |
| 739,068 A1 | 6/2008 | Mazur et al. | |
| 744,262 A1 | 10/2008 | Mazur et al. | |
| 7,504,325 B2 | 3/2009 | Koezuka et al. | |
| 7,649,156 B2 * | 1/2010 | Lee | 219/121.73 |
| 2009/0213883 A1 * | 8/2009 | Mazur et al. | 372/25 |

OTHER PUBLICATIONS

Scott Specialy Gases Electronic Materials Group-Dopants. http://www.scottsemicon.com/Dopants.html. As accessed on Mar. 30, 2009. 2 pages.

Carey et al., "Fabrication of Micrometer-Sized Conical Field Emitters Using Femto-second laser Assisted Etching," Proc. IVMC 2001 (Davies, CA 2001) 75-76 (2001).

Carey et al., "Field emission from Silicon Microstructures Formed by Femtosecond Laser Assisted Etching," Proc. CLEO 2001 (Baltimore, MD 2001) 555-557.

Carey, et al., "High Sensitivity Silicon-Based VIS/NIR Photodetectors", Optical Society of America (2003) 1-2.

(Continued)

*Primary Examiner* — N Drew Richards
*Assistant Examiner* — Robert Carpenter
(74) *Attorney, Agent, or Firm* — Thorpe North & Western LLP

(57) ABSTRACT

Methods, systems, and devices associated with surface modifying a semiconductor material are taught. One such method includes providing a semiconductor material having a target region and providing a dopant fluid layer that is adjacent to the target region of the semiconductor material, where the dopant fluid layer includes at least one dopant. The target region of the semiconductor material is lased so as to incorporate the dopant or to surface modify the semiconductor material. During the surface modification, the dopant in the dopant fluid layer is actively replenished.

15 Claims, 4 Drawing Sheets

OTHER PUBLICATIONS

Carey, et al., "Femtosecond Laser-Assisted Microstructuring of Silicon for Novel Detector, Sensing and Display Technologies", LEOS Oct. 26, 2003 (Tuscan, AR, 2003) 481-482.

Carey, et al., "Femtosecond Laser-Assisted Microstructuring of Silicon for Novel Detector, Sensing and Display Technologies", LEOS 2002 (Glasgos, Scotland, 2002) 97-98.

Carey, et al., "Femtosecond-Laser-Assisted Microstructuring of Silicon Surfaces", Optics and Photonics News, 14, 32-36 (2003).

Crouch et al., "Infrared Absorption by Sulfur-Doped Silicon Formed by Femtosecond Laser Irradiation", Appl. Phys. A, 79, 1635-1641 (2004).

Crouch et al., "Comparison of Structures and Properties of Femosecond and Nanosecond Laser-Structured Silicon" Appl. Phys. Lett., 84, 1850-1852 (2004).

Dolgaev et al., "Formation of Conical Microstructures Upon Laser Evaporation of Solids", Appl. Phys. A, 73, 177-181 (2001).

Fowlkes et al., "Surface Microstructuring and Long-Range Ordering of Silicon Nanoparticles", Appl. Phys. Lett., 80 (20), 3799-3801 (2002).

Her et al., "Novel Conical Microstructures Created in Silicon With Femtosecond Laser Pulses", CLEO 1988 (San Fransico, CA 1998) 511-512.

Hu et al., "Solar Cells from Basic to Advanced Systems," McGraw Hill Book Co. NY 1983, pg. 39.

Pedraza et al., "Surface Nanostructuring of Silicon", Appl. Phys. A, 77, 277-284 (2003).

Pedraza et al., "Silicon Microcolumn Arrays Grown by Nanosecond Pulsed-Excimer Laser Irradiation", Appl. Phys. Lett., 74 (16), 2322-2324 (1999).

Sanchez et al., "Dynamics of the Hydrodynamical Growth of Columns on Silicon Exposed to ArF Excimer-Laser Irradiation ", Appl. Phys. A, 66, 83-86 (1998).

Sanchez et al., "Whiskerlike Structure Growth of Silicon Exposed to ArF Excimer Laser Irradiation", Appl. Phys. Lett., 69 (5), 620-622 (1996).

Serpenguzel et al., "Temperature Dependence of Photluminescence in Non-Crystalline Silicon", Photonics West (San Jose, CA, 2004) 454-462.

Solar Energy Research Institute, "Basic Photovoltaic Principles and Methods," Van Nostrand Reindhold Co., NY 1984, pp. 45-47 and 138-142.

Younkin et al., "Infrared Absorption by Conical Silicon Microstructures Made in a Variety of Background gases Using Femtosecond-Laser Pulses", J. Appl. Phys., 93, 2626-2629 (2003).

Shen et al., "Formation of Regular Arrays of Silicon Micorspikes by Femotsecond Laser Irradiation Through a Mask", Appl. Phys. lett., 82, 1715-1717 (2003).

Wu et al., "Visisble Luminescence From Silicon Surfaces Microstructured in Air". Appl. Phys. Lett., 81, 1999-2001 (2002).

Wu. C. et al., "Black Silicon a New Light Absorber," APS Centennial Meeting (Mar. 23, 1999).

Her et al., "Microstructuring of silicon with femtosecond laser pulses," Applied Physics Letters, vol. 73, No. 12, Sep. 21, 1998.

Her et al., "Femtosecond laser-induced formation of spikes on silicon," Applied Physics A 70. 383-385 (2000).

Wu et al., "Femtosecond laser-gas-solid interactions," These presented to the Department of Physics at Harvard University, pp. 1-113, 126-136, Aug. 2000.

Younkin, "Surface studies and microstructure fabrication using fetosecond laser pulses," Thesis presented to the Division of Engineering & Applied sciences at Harvard University (Aug. 2001).

PCT Application PCT/US10/32829; filed Apr. 28, 2010; Jason Sickler; ISR mailed Dec. 14, 2010.

* cited by examiner

SEMICONDUCTOR SURFACE MODIFICATION

FIELD OF THE INVENTION

The present invention relates generally to systems, methods, and devices for surface-modifying semiconductor materials. Accordingly, the present application involves the fields of physics, chemistry, electricity, and material science.

BACKGROUND

Short-pulse laser radiation can be used to create or treat a variety of semiconductor materials in order to enhance their functionality. For example, the properties of silicon photo detectors can be improved and stabilized using short pulse laser radiation treatment. Current techniques for semiconductor surface modification, including doping, using short-pulse laser radiation typically require vacuum evacuation of a sealed chamber containing the material to be surface-modified then filling the chamber with doping fluids or inert fluids so in order to create an environment conducive to the process.

However, these techniques and other approaches still suffer from drawbacks such as dopant fluid consumption, contamination by process by-products, beam path interference, inefficient batch processing, manufacturing complexities, and semiconductor substrate size limitations, among others.

SUMMARY OF THE INVENTION

Accordingly, the present invention provides systems and methods having enhanced efficiencies and reliability for manufacturing doped and/or surface modified semiconductor materials, including semiconductor materials and devices incorporating the same. In one aspect, a method of doping a semiconductor material is provided. Such a method includes providing a semiconductor material having a target region, and providing a dopant fluid layer, including a dopant, adjacent to the target region of the semiconductor material. The method further includes lasing (providing laser radiation to) the target region of the semiconductor material through the dopant fluid layer to incorporate the dopant into the target region of the semiconductor material. The dopant fluid layer is actively replenished during the doping of the semiconductor material.

In another aspect, a system for surface-modifying a semiconductor material is provided. Such a system includes a semiconductor material having a target region, a dopant fluid layer having a dopant, wherein the dopant fluid layer is disposed adjacent to the target region of the semiconductor material. The system further includes a support surface configured to support the semiconductor material, a dopant fluid input system, and a laser. The dopant fluid input system is operable to actively regulate the dopant fluid layer over a target region of the semiconductor material. The laser is positioned to lase the target region of the semiconductor material through the dopant fluid layer.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

Additional features and advantages of the invention will be apparent from the detailed description that follows, taken in conjunction with the accompanying drawings, which together illustrate, by way of example, features of the invention; and, wherein.

Figure 1:
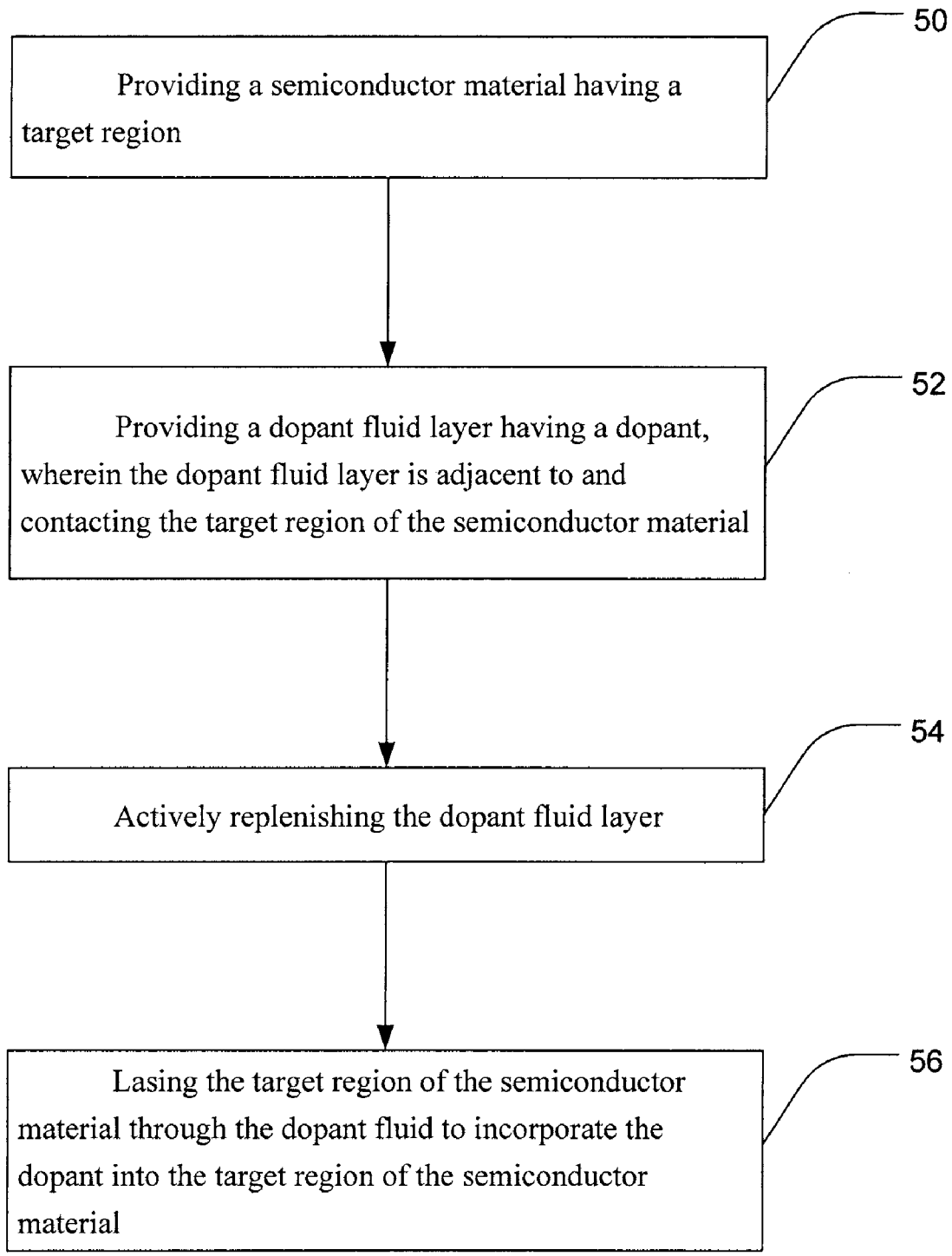
FIG. 1 is a flow chart depicting various steps in a method for doping a semiconductor material according to one embodiment of the present invention.

The drawings will be described further in connection with the following detailed description. Further, these drawings are not necessarily to scale and are by way of illustration only such that dimensions and geometries can vary from those illustrated.

DETAILED DESCRIPTION OF EXAMPLE EMBODIMENT(S)

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an," and "the" include plural referents unless the context clearly dictates otherwise. Thus, for example, reference to "a dopant" includes one or more of such dopants and reference to "the semiconductor material" includes reference to one or more of such materials.

DEFINITIONS

In describing and claiming the present invention, the following terminology will be used in accordance with the definitions set forth below.

As used herein, the term "actively" when used to describe the replenishing or replenishment of a dopant fluid layer refers to intermittently or continuously adding dopant to the dopant fluid layer. It is noted that, for the purposes of this discussion, the term "intermittently" can refer to either regular or sporadic additions of dopant to the dopant fluid layer. Whether continuous or intermittent, the active replenishment of the dopant fluid layer does not include situations where a vacuum is released from a chamber containing a semiconductor material and a dopant is added, followed by the reestablishment of a vacuum in the chamber. It is thus intended that active replenishment be accomplished at room pressure.

As used herein, the term "room pressure" refers to the pressure immediately outside of an enclosure in which the surface modification and/or doping is occurring. Thus the term "room pressure" is intended to describe the situation where the pressure inside the enclosure is substantially the same as the pressure outside of the enclosure. It is noted that the room pressure will vary with altitude, and it is intended that this term be relative to the altitude at which the method is performed. In some aspect, however, room pressure can be measured relative to atmospheric pressure. For example, in one aspect room pressure is within 15% of atmospheric pressure. In another aspect, room pressure is within about 10% of atmospheric pressure. In yet another aspect, room pressure is within about 5% of atmospheric pressure. It should also be noted that the term "atmospheric pressure" refers to the pressure of the atmosphere at sea level, namely about 760 Torr.

As used herein, the term "fluid" refers to a continuous amorphous liquid or gas that tends to flow and to conform to an enclosing structure.

As used herein, the phrase "shallow junction photonic material" refers to a thin (e.g. less than 1 μm thick) area of semiconductor material that is sensitive to electromagnetic radiation over a broad spectrum of wavelengths in the range of about 250 nm-10,000 nm.

As used herein, the term "target region" refers to an area of a semiconductor material that is intended to be doped or surface modified using laser radiation. The target region of a semiconductor material can vary as the surface modifying process progresses. For example, after a first target region is doped or surface modified, a second target region may be selected on the same semiconductor material.

As used herein, the terms "surface modifying" and "surface modification," refer to the altering of a surface of a semiconductor material using laser radiation. Surface modification can include processes using primarily laser radiation or laser radiation in combination with a dopant, whereby the laser radiation facilitates the incorporation of the dopant into a surface of the semiconductor material. Accordingly, in one embodiment surface modification includes doping of a semiconductor material.

As used herein, the term "fluence" refers to the amount of energy from a single pulse of laser radiation that passes through a unit area. In other words, "fluence" can be described as the energy density of one laser pulse.

As used herein, "adjacent" refers to being near or sufficiently close to achieve a desired affect. Although direct physical contact is most common and preferred in the layers of the present invention, adjacent can broadly allow for spaced apart features, provided the functionality of the methods described herein can be accomplished.

As used herein, the term "substantially" refers to the complete or nearly complete extent or degree of an action, characteristic, property, state, structure, item, or result. For example, an object that is "substantially" confined would mean that the object is either completely confined or nearly completely confined. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation should apply regardless of the breadth of the range or the characteristics being described. It should also be noted that the above discussion also applies to non-integer numbers.

The Invention

The present invention provides systems, materials, and methods having enhanced efficiency and reliability for manufacturing doped and/or surface modified semiconductor materials. As has been described, one problem with current techniques is the need to perform doping procedures under vacuum. Such a process can be laborious due to the need for sealing a chamber, pulling a vacuum, and introducing a dopant into the sealed chamber. Additional problems that may arise include maintaining dopant concentration due to depletion of the dopant during the procedure and the accumulation of contaminants from the doping process. In order to supplement the dopant concentration or remove contaminants, the vacuum would most likely need to be released and the chamber opened to allow access, during which doping would necessarily be halted.

The inventors have discovered that laser surface modification and/or doping can be accomplished in the absence of a vacuum by using a dopant fluid layer to substantially exclude air from the semiconductor surface being lased. Such a process can be performed in an open-air enclosure or in an enclosure with a transparent cover but without a vacuum being applied beyond what may be used to draw off a portion of the dopant fluid layer. Thus the dopant fluid layer functions to provide a dopant to the surface being modified while at the same time substantially excluding air from that same surface. Additionally, because of the absence of a vacuum, the dopant fluid layer can be actively replenished during the lasing process. As the dopant fluid layer is turned over during replenishment, contaminants that may otherwise interfere with the process can also be eliminated therefrom without halting the surface modification.

A variety of methods for actively replenishing the dopant fluid layer are contemplated, all of which should be included in the present scope. In one embodiment, for example, the dopant fluid layer can be actively replenished by providing a continuous addition of dopant to the dopant fluid layer. Such a continuous addition can include adding a constant amount of dopant continuously, or it can include adding a fluctuating amount of dopant continuously over time. In another embodiment, the dopant fluid layer can be actively replenished by intermittent additions of a dopant to the dopant fluid layer over time. Of course the intermittent additions can be of the same amount of dopant or of different amounts of dopant.

In order to maintain the dopant concentration within a predetermined range, it can be useful to regulate the active replenishment of the dopant fluid layer using a feedback mechanism. In one embodiment, the dopant concentration of the dopant fluid layer can be regulated using a feedback from a dopant concentration detector. The dopant concentration detector can be positioned within the dopant fluid layer, thereby allowing the dopant concentration detector to accurately measure and regulate the dopant concentration of the dopant fluid layer. In another embodiment, the active replenishment can be regulated using a contaminant detector. The contaminant detector can be configured to regulate either the addition of dopant to the dopant fluid layer or removal of a portion of the dopant fluid layer, or both. Similar to the dopant concentration detector, the contaminant detector can be positioned in a location that allows it to accurately measure the concentration of contaminants within the dopant fluid layer. When the contaminant concentration exceeds acceptable levels, the contaminant detector can regulate the active replenishment of the dopant fluid layer in order to reduce the concentration of the contaminants.

Active replenishment of the dopant fluid layer can have numerous advantages for surface modifying procedures. For example, the concentration of the dopant at the site of surface modification can be closely maintained or varied depending on the desired results of the modification process. In some cases, a more uniform surface modification can be obtained if the concentration of the dopant at the semiconductor surface is maintained within a predetermined range. The resulting doped semiconductor material can thus have improved surface modification uniformity, thereby providing enhanced semiconductor performance. In other cases, a varied or graded surface modification may be desirable, and such can be accomplished by varying the concentration of dopant during the procedure. This level of control of the surface modification has generally not been feasible using traditional vacuum-sealed chambers.

With the above discussion in mind, the present invention provides methods for doping a semiconductor material. In one specific embodiment, as is shown in FIG. 1, a method for doping a semiconductor material can include providing a semiconductor material having a target region 50 and providing a dopant fluid layer 52. The dopant fluid layer can include a dopant and is disposed adjacent to the target region of the semiconductor material. In one specific aspect, the dopant fluid layer is adjacent to and contacting the target region. The method further includes actively replenishing the dopant fluid layer 54 and lasing the target region of the semiconductor material through the dopant fluid layer to incorporate dopant from the dopant fluid layer into the target region of the semiconductor material 56. In one embodiment, the surface modification can be accomplished at room pressure.

Figure 2:
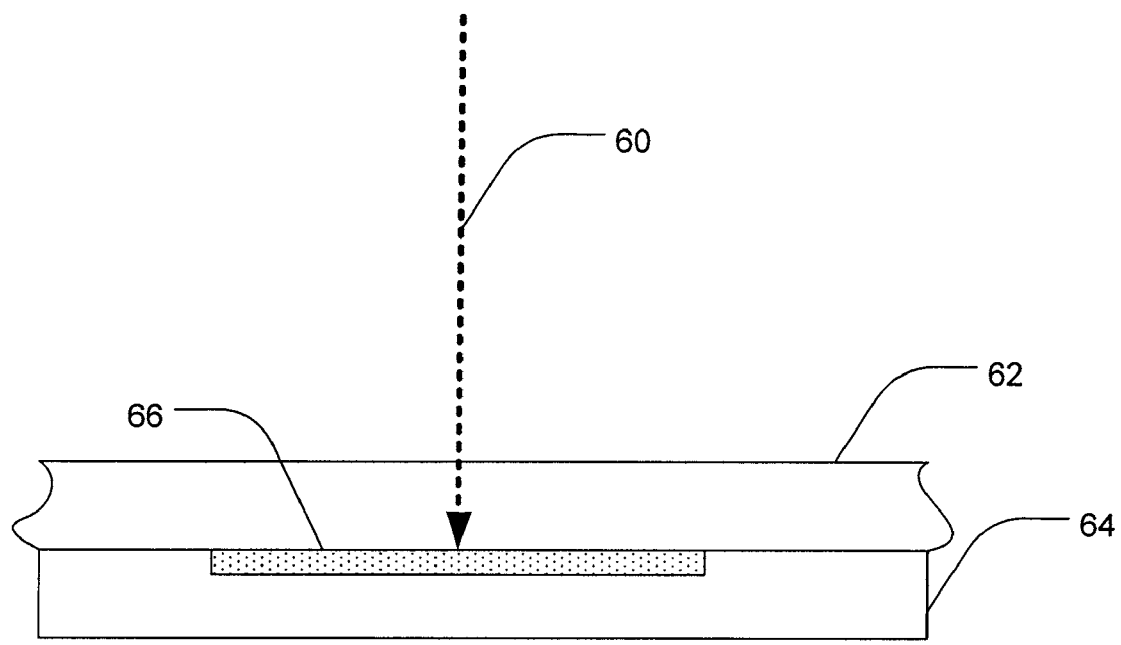
FIG. 2 is an illustration of a system for surface modifying a semiconductor material in accordance with another embodiment of the present invention.
Figure 3:
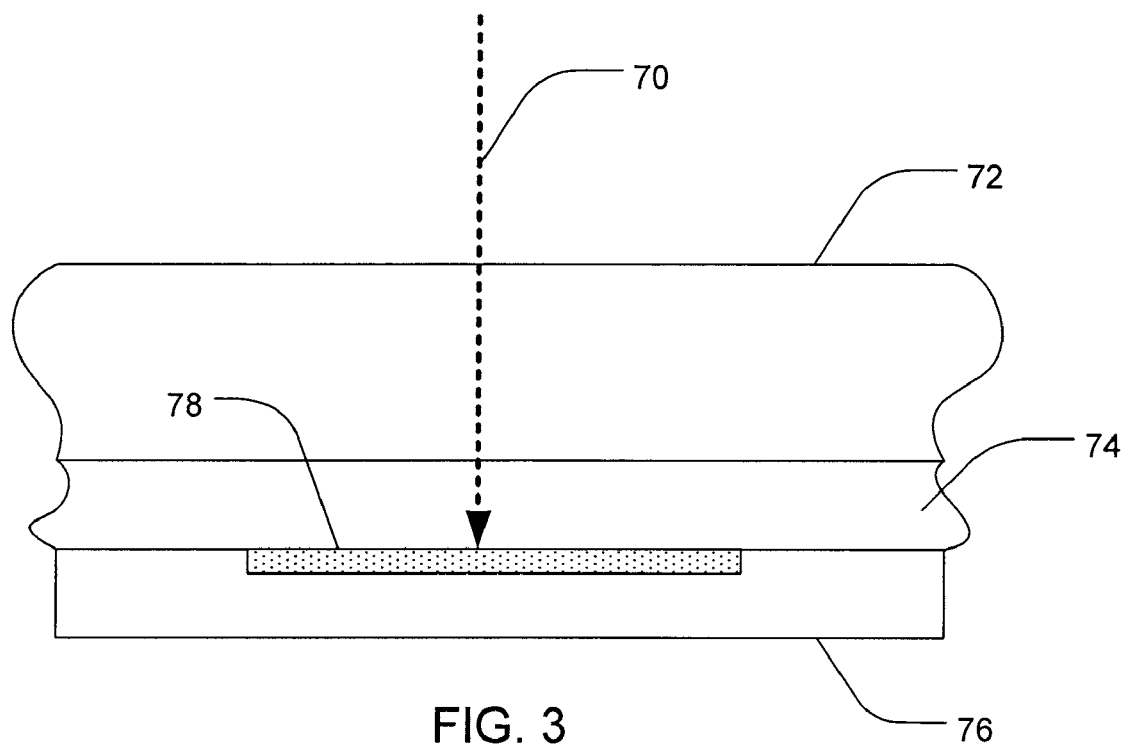
FIG. 3 is an illustration of a system for surface modifying a semiconductor material in accordance with yet another embodiment of the present invention.

FIGS. 2 and 3 provide general examples of spatial relationships of various components used in the above described method according to various embodiments of the present invention. For example, FIG. 2 shows laser radiation 60 passing through a dopant fluid layer 62 and onto a target region 66 of a semiconductor material 64. FIG. 3 shows another embodiment in which laser radiation 70 passes through a barrier fluid layer 72 and a dopant fluid layer 74 prior to contacting a target region 78 of a semiconductor material 76. As can be seen in FIG. 3, the barrier fluid layer contains the dopant fluid layer adjacent to the semiconductor material. In both embodiments shown in FIGS. 2 and 3, the dopant fluid layer is adjacent to the semiconductor material and situated between the semiconductor material and the laser, and air is being substantially excluded from the target area by the presence of the dopant fluid layer. As such, a vacuum is not required to perform such surface modification procedures. It should be noted, however, that in some aspects the dopant fluid layer need not be directly adjacent to the semiconductor material. In one aspect, for example, a barrier fluid layer can be generated between the semiconductor material and the dopant fluid layer in order to substantially exclude air from the surface of the target region. In this case, dopant from the dopant fluid layer can be transferred from the dopant fluid layer, through the barrier fluid layer, and into the target region of the semiconductor material. Although several reasons for this configuration are contemplated, in one example it may be beneficial in situations where a particular dopant fluid layer more readily mixes with oxygen from the atmosphere than does the barrier fluid layer.

The present invention additionally provides materials and devices according to various embodiments of the present invention. In one embodiment, for example, a semiconductor material made according to the methods described herein is provided. The semiconductor material can be a single-layer semiconductor material having a single-layer target region, or it can be a multi-layer semiconductor material having multiple layers of target regions. In another embodiment, a device incorporating such a semiconductor material is provided. These semiconductor materials and devices containing such semiconductor materials can be used in a broad spectrum of electronic devices that utilize surface modified semiconductor materials. Such devices are well known in the art, and any such device should be considered to be within the present scope. Specific examples include photovoltaic devices, photodiodes, light emitting diodes, laser diodes, and the like. As one specific non-limiting example, the semiconductor material produced can be a shallow junction photonic material.

Figure 4:
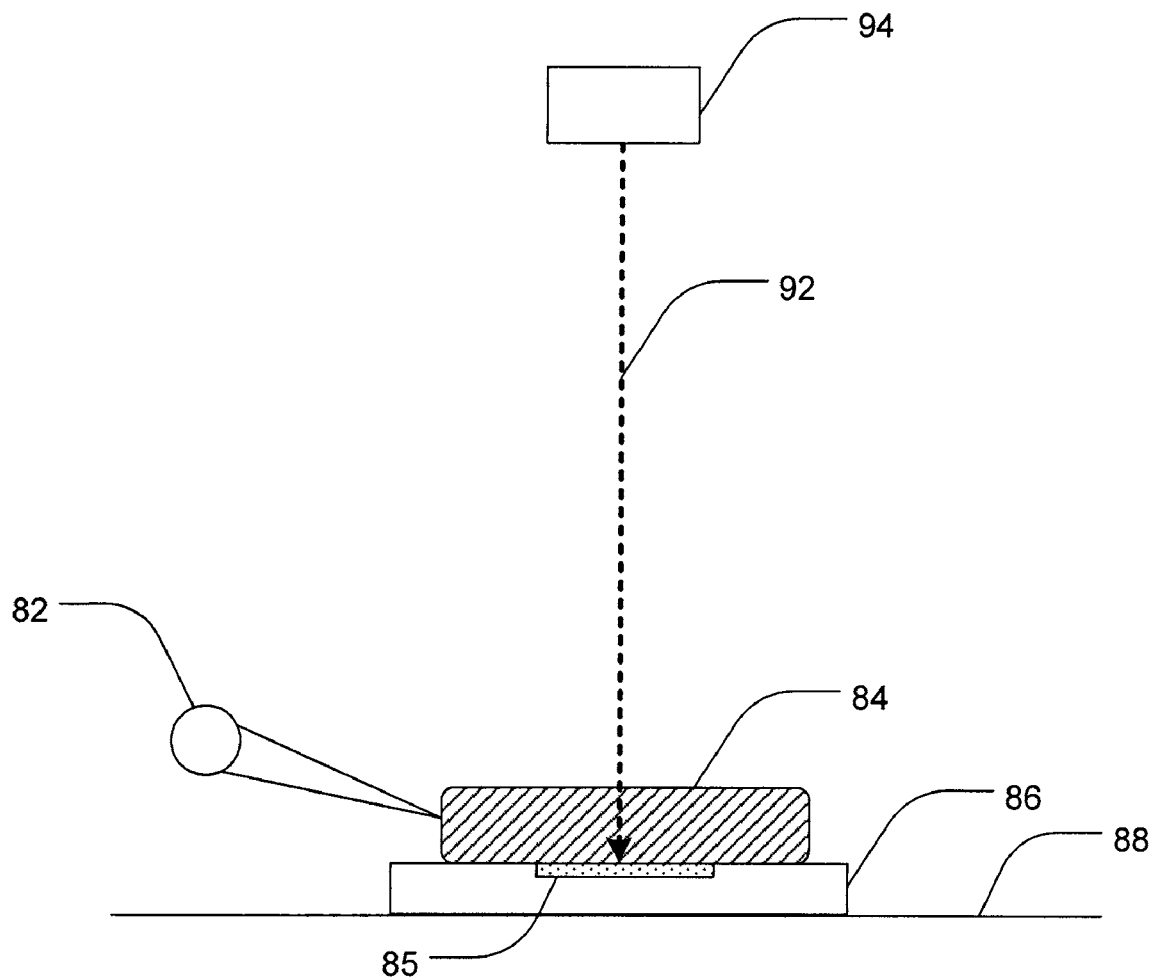
FIG. 4 is an illustration of a system for surface modifying a semiconductor material in accordance with a further embodiment of the present invention.
Figure 5:
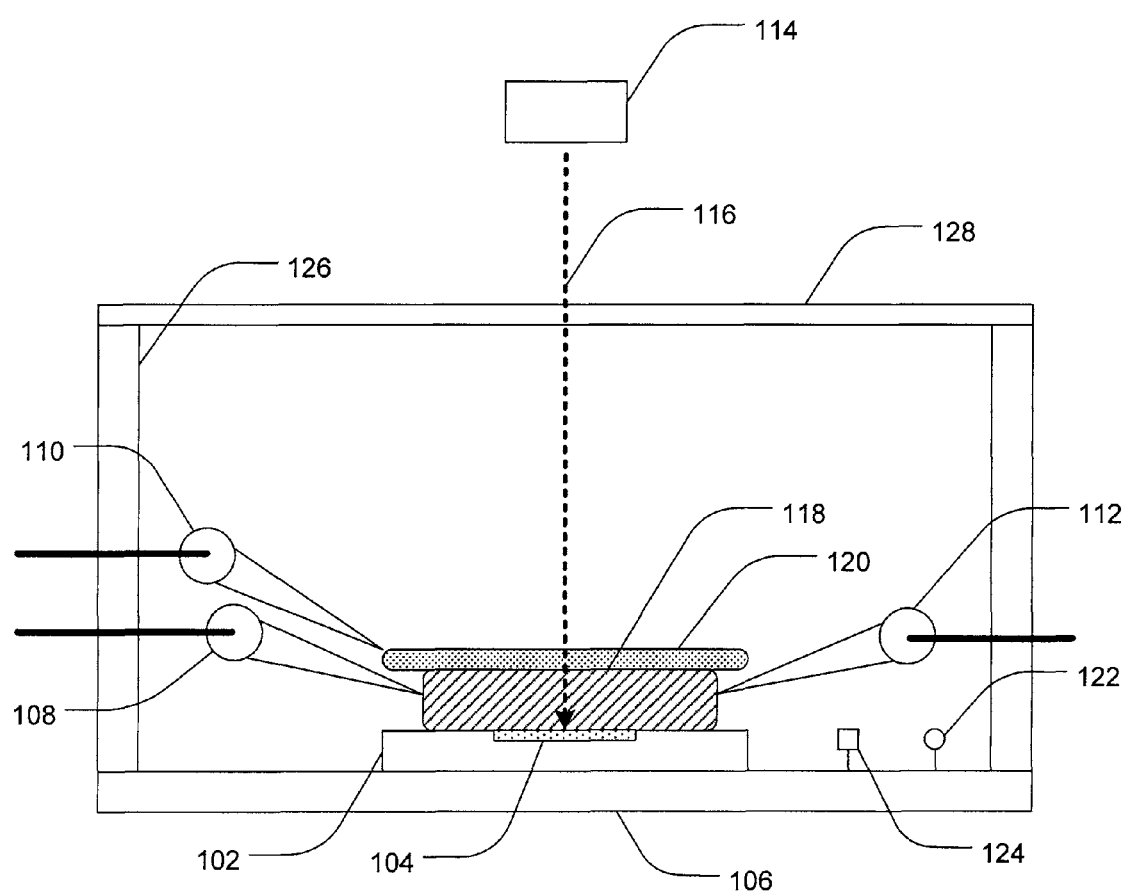
FIG. 5 is an illustration a system for surface modifying a semiconductor material in accordance with yet a further embodiment of the present invention.

The present invention additionally provides systems for surface modifying a semiconductor material. Exemplary embodiments of systems of the present invention are shown in FIGS. 4 and 5. Referring to FIG. 4, a semiconductor surface-modifying system can include a semiconductor material 86 having a target area 85, a support surface 88 configured to support the semiconductor material, a dopant fluid input system 82, and a laser 94 for providing laser radiation 92 to the semiconductor material. The system further includes a dopant fluid layer 84 that is generated and actively regulated by the dopant fluid input system. The dopant fluid layer is generated over the target region of the semiconductor material to substantially preclude air at the site of lasing. Note that the laser produces laser radiation through the dopant fluid layer and onto the target area such that dopant within the dopant fluid layer is incorporated into the semiconductor material. Optionally, the system can include a barrier layer, a barrier layer system, and a dopant fluid outlet system (not shown).

In another embodiment of the present invention, as is shown in FIG. 5, a system for surface modifying a semiconductor can include a semiconductor material 102 having a target area 104, a support surface 106 configured to support the semiconductor material, a dopant fluid input system 108, a barrier fluid input system 110, a dopant fluid outlet system 112, and a laser 114 for providing laser radiation 116 to the target area of the semiconductor material. The system further includes a dopant fluid layer 118 that is generated and actively regulated by the dopant fluid input system. The dopant fluid layer is generated over the target region of the semiconductor material to substantially preclude air at the site of lasing. A barrier fluid layer 120 is generated and actively regulated by the barrier layer input system. In one aspect the barrier fluid layer is generated in order to contain the barrier fluid layer adjacent to the semiconductor material. The system can further include a contaminant detector 122, a dopant concentration detector 124, or a contaminant detector and a dopant concentration detector. The contaminant detector can be positioned to detect the concentration or presence of contaminants in the dopant fluid layer, and can thus provide feedback to either the dopant fluid input system or the dopant fluid outlet system or both to facilitate regulation of the dopant fluid layer. The dopant concentration detector can be positioned to detect the concentration of the dopant in the dopant fluid layer, and can thus provide feedback to the dopant fluid input system to facilitate regulation of the dopant fluid layer. It should be noted that these detectors are shown in FIG. 5 out of the dopant fluid layer for the sake of simplicity, and that it is intended that they be located within the dopant fluid layer. In one aspect, the barrier fluid layer can be useful in removing contaminants from the enclosure. As the barrier fluid layer is moved across the dopant fluid layer, contaminants can enter the barrier fluid layer and be removed as the barrier fluid layer is recycled.

As has been described, FIG. 5 shows a dopant fluid outlet system 112 that is configured to draw off a portion of the dopant fluid layer during the surface modification process. The dopant fluid outlet system can be passive, i.e. it can merely be an overflow, or it can be active. An active dopant fluid outlet system can thus actively draw away a portion of the dopant fluid layer. In one embodiment, this drawing away process can be utilized to control the level of contaminants in the system by removing a portion of the dopant fluid layer. In another embodiment, the drawing away process can be utilized to refresh the dopant fluid layer. In other words, dopant fluid having a low concentration of dopant can be removed and replaced with dopant fluid having a higher dopant concentration. The active drawing away can be continuous or intermittent, and can be regulated by a dopant fluid concentration detector and/or a contaminant detector.

The systems of the present invention can include a variety of support surfaces, enclosures, or other structural components. For example, FIG. 5 also shows an enclosure 126 associated with the support surface 106 to, among other functions, assist in containing the dopant fluid layer 118. In another embodiment, the system can include a lid 128 which can be removably associated with the enclosure. The enclosure can have a variety of functional roles such as providing mechanical support for other components of the system. In one embodiment, the enclosure can be configured to substantially confine the dopant fluid layer. The support surface and related enclosure structures can be made of a variety of materials. In one embodiment, the support surface and related enclosure structures can be made of inert materials such as, but not limited to polytetrafluoroethylene, PVDF, polytetrafluoroethylene (Teflon®) coated aluminum, and the like.

It should be noted that the presence of a lid over the enclosure does not indicate the presence of a vacuum within the enclosure. When a lid is used over the enclosure, the interior of the enclosure is maintained at substantially room pressure, and air is substantially precluded from the surface of the semiconductor material by the presence of the dopant fluid layer. Additionally, it is desirable that the lid be made of a material transparent to the laser radiation to thus provide minimal distortion of the laser radiation as it passes therethrough. Non-limiting examples of inert transparent materials from which the lid can be made include fused silica (such as Dow Corning® 7940), BK7 glass, sapphire, and the like. Although not shown in FIG. 5, in one embodiment, the laser that emits the laser radiation can be disposed on or within the lid so that the laser radiation does not pass through the lid prior to irradiating the semiconductor material.

As has been described herein, in one aspect a barrier fluid layer can be utilized to contain the dopant fluid layer adjacent to the semiconductor material. As has also been described, a barrier fluid layer can be generated between the target region and the dopant fluid layer. In one embodiment, the barrier fluid layer can have an active flow of barrier fluid that runs substantially parallel to the semiconductor material. Generally, any barrier fluid can be used in the formation of the barrier fluid layer provided such a barrier fluid does not unduly interfere with the surface modification of the semiconductor material. In one embodiment, for example, the barrier fluid can be an inert fluid such as, but not limited to, nitrogen, argon, neon, helium, and the like. It should be noted that the term "inert" refers to a barrier fluid layer that does not unduly interfere with the surface modification process, and does not necessarily mean that the barrier fluid is inert with respect to all materials.

Lasers and laser radiation are well known in the art. The type of laser radiation used to surface modify a semiconductor material can vary depending on the material and the intended modification. Any laser radiation known in the art can be used with the systems and methods of the present invention. There are a number of laser characteristics that can affect the surface modification process and/or the resulting product including, but not limited to the wavelength of the laser radiation, pulse width, pulse fluence, pulse frequency, polarization, laser propagation direction relative to the semiconductor material, etc. In one embodiment, a laser can be configured to provide pulsatile lasing of a semiconductor material. Such laser pulses can have a central wavelength in a range of about from about 10 nm to about 8 μm, and more preferably from about 200 nm to about 1200 nm. The pulse width of the laser radiation can be in a range of about tens of femtoseconds to about hundreds of nanoseconds. In one embodiment, the laser pulse widths are in a range of from about 50 femtoseconds to about 50 picoseconds. In another embodiment, the laser pulse widths are in the range of from about 50 to 500 femtoseconds.

The number of laser pulses irradiating the semiconductor target region can be in a range of from about 1 to about 2000. In one embodiment, the number of laser pulses irradiating the semiconductor target region can be from about 2 to about 1000. Further, the repetition rate or frequency of the pulses can be selected to be in a range of from about 10 Hz to about 10 μHz, or in a range of from about 1 kHz to about 1 MHz, or in a range from about 10 Hz to about 1 kHz. Moreover, the fluence of each laser pulse can be in a range of from about 1 $kJ/m^2$ to about 20 $kJ/m^2$, and more preferably in a range of from about 3 $kJ/m^2$ to about 8 $kJ/m^2$.

A variety of semiconductor materials are contemplated for use with the surface modification processes of the present invention, all of which should be considered to be within the present scope. Examples of such semiconductor materials can include group IV materials, group II-VI materials, and group III-V materials from the periodic table. More specifically, exemplary group IV materials can include silicon, carbon (e.g. diamond), germanium, and combinations thereof. Various combinations of group IV materials can include silicon carbide and silicon germanium. It should be noted that amorphous moieties are also included in the group IV materials and those that follow. Exemplary amorphous materials include amorphous diamond and amorphous silicon. Exemplary group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), and mercury zinc selenide (HgZnSe).

Exemplary group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP); and combinations thereof.

In one embodiment, the semiconductor material can be selected from the group consisting of silicon, carbon, germanium, aluminum nitride, gallium nitride, indium gallium arsenide, aluminum gallium arsenide, and combinations thereof. In yet another embodiment, the semiconductor material can be silicon.

A variety of dopant fluid layer materials are contemplated, and any such material that can be used to surface modify a semiconductor material according to the present invention should be considered to be within the present scope. It should be noted that the particular dopant utilized can vary depending on the semiconductor being surface modified, and the intended use of the resulting semiconductor material. Non-limiting examples can include, however, sulfur-containing fluids such as $H_2S$, $SF_6$, and $SO_2$; fluorine containing fluids such as $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, and $NF_3$; boron containing fluids such as $B(CH_3)_3$, $BF_3$, $BCl_3$, and $B_2H_6$; phosphorous containing fluids such as $PF_5$ and $PH_3$; chlorine containing fluids such as $Cl_2$, $SiH_2Cl_2$, HCl, $SiCl_4$; arsenic containing fluids such as $AsH_3$; antimony containing fluids; and mixtures and combinations thereof. In one embodiment, the dopant fluid can have a density that is greater than air. In another embodiment, the dopant fluid can include $H_2S$, $SF_6$, Se, Te, or mixtures thereof. In a further embodiment, the dopant fluid can be an electron donating element or a hole donating element. In yet another one embodiment, the dopant in the dopant fluid layer can be $SF_6$ and can have a predetermined concentration range of $5.0 \times 10^{-8}$ mol/cm$^3$-$5.0 \times 10^{-4}$ mol/cm$^3$.

EXAMPLE

A silicon is covered in an $SF_6$ dopant gas (i.e. fluid) layer at a gas concentration of $4.3 \times 10^{-4}$ mol/cm$^3$ is provided at an input port, and is removed at an output port. The surface of the silicon is irradiated with pulsed laser radiation with a center wavelength of 800 nm, pulse duration of 100 fs, repetition rate of 1 kHz, and a fluence of 7 kJ/m$^2$.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

The invention claimed is:

1. A method for doping a semiconductor material, comprising:
   providing a semiconductor material having a target region;
   providing a dopant fluid layer adjacent to the target region of the semiconductor material, wherein the dopant fluid layer includes at least one dopant;
   actively replenishing the dopant fluid layer; and
   lasing the target region of the semiconductor material through the dopant fluid layer to incorporate the dopant into the target region of the semiconductor material, wherein the lasing is performed in an enclosure that is devoid of a cover and with a laser pulse duration of between about 50 femtoseconds and about 50 picoseconds.

2. The method of claim 1, wherein the semiconductor material is selected from the group consisting of group IV materials, group II-VI materials, group III-V materials, and combinations thereof.

3. The method of claim 1, wherein the semiconductor material is silicon.

4. The method of claim 1, wherein the dopant fluid layer is a member selected from the group consisting of sulfur containing fluids, fluorine containing fluids, boron containing fluids, phosphorous containing fluids, chlorine containing fluids, arsenic containing fluids, arsenic containing fluids, antimony containing fluids, and mixtures thereof.

5. The method of claim 1, wherein the dopant fluid is a member selected from the group consisting of $H_2S$, $SF_6$, Se, Te, and combinations thereof.

6. The method of claim 1, wherein the dopant fluid is a member selected from the group consisting of at least one of an electron donating element or a hole donating element.

7. The method of claim 1, wherein actively replenishing maintains the concentration of the dopant in the dopant fluid layer in a predetermined range.

8. The method of claim 1, further comprising regulating the active replenishment by measuring the dopant concentration or by measuring a contaminant in the dopant fluid layer.

9. The method of claim 1, further comprising actively drawing a portion of the dopant fluid layer away from the target region of the semiconductor material.

10. The method of claim 9, further comprising regulating the active drawing of the dopant fluid away from the target region by measuring the dopant concentration or by measuring a contaminant in the dopant fluid layer.

11. The method of claim 1, wherein the lasing of the target region is performed at room pressure.

12. The method of claim 1, wherein the method further includes providing a barrier fluid layer adjacent to the dopant fluid layer and opposite the semiconductor material, wherein the barrier fluid layer substantially confines the dopant fluid layer proximal to the semiconductor material.

13. The method of claim 12, wherein the barrier fluid layer is comprised of a member selected from the group consisting of nitrogen, argon, neon, helium, and mixtures thereof.

14. The method of claim 1, wherein lasing the target region of the semiconductor material comprises lasing with a laser pulse having a duration of from about 50 to 500 femtoseconds.

15. The method of claim 1, wherein providing a dopant fluid layer further comprises providing the dopant in the dopant fluid layer in a concentration range of $5.0 \times 10^{-8}$ mol/cm$^3$ to $5.0 \times 10^{-4}$ mol/cm$^3$.

* * * * *